United States Patent
Williams

(10) Patent No.: US 8,400,321 B2
(45) Date of Patent: Mar. 19, 2013

(54) METHODS AND APPARATUS FOR OPERATING AN ELECTRONIC TRIP DEVICE

(75) Inventor: Craig B. Williams, Louisville, KY (US)

(73) Assignee: General Electric Company, Schenectady, NY (US)

( * ) Notice: Subject to any disclaimer, the term of this patent is extended or adjusted under 35 U.S.C. 154(b) by 314 days.

(21) Appl. No.: 12/946,419

(22) Filed: Nov. 15, 2010

(65) Prior Publication Data

US 2012/0119918 A1    May 17, 2012

(51) Int. Cl.
*G08B 21/00* (2006.01)
*G01R 31/14* (2006.01)

(52) U.S. Cl. ........ 340/664; 340/657; 324/500; 324/509; 324/523; 324/527

(58) Field of Classification Search .................. 340/664, 340/657, 650, 652; 324/500, 509, 522, 523, 324/527
See application file for complete search history.

(56) References Cited

U.S. PATENT DOCUMENTS

| | | | |
|---|---|---|---|
| 5,956,218 A * | 9/1999 | Berthold | 361/42 |
| 6,807,036 B2 | 10/2004 | Baldwin | |
| 7,576,960 B2 | 8/2009 | Gao et al. | |
| 7,636,224 B2 * | 12/2009 | Zandonella Balco | 361/42 |
| 2006/0125622 A1 | 6/2006 | Baldwin et al. | |
| 2008/0151463 A1 | 6/2008 | Dwyer et al. | |
| 2010/0067159 A1 | 3/2010 | Topucharla et al. | |
| 2010/0165520 A1 | 7/2010 | Williams | |

FOREIGN PATENT DOCUMENTS

| | | |
|---|---|---|
| WO | 2007025202 A2 | 3/2007 |
| WO | 2009095304 A1 | 8/2009 |

* cited by examiner

*Primary Examiner* — Toan N Pham
(74) *Attorney, Agent, or Firm* — Global Patent Operations

(57) ABSTRACT

An electronic trip device is described that includes a test signal generator coupled to at least one of a line conductor and a neutral conductor and configured to create a test signal. The electronic trip device also includes a leakage current detection circuit configured to compare a current in the line conductor and a current in the neutral conductor, the leakage current detection circuit configured to output an error signal if the test signal is not detected.

20 Claims, 12 Drawing Sheets

METHODS AND APPARATUS FOR OPERATING AN ELECTRONIC TRIP DEVICE

BACKGROUND OF THE INVENTION

The field of the invention relates generally to an electronic trip device, and more specifically, to methods and systems for automatic testing of a ground fault circuit interrupter (GFCI).

Circuit breakers currently used to protect, for example, a residential or commercial environment, generally detect the presence of overcurrent conditions and release an operating mechanism to separate the circuit breaker contacts. A circuit breaker may also include ground fault detection capabilities, for example, by including an electronic trip device. An electronic trip device may also be referred to as an electronic trip control unit. A circuit breaker that includes ground fault detection capabilities may be referred to as a ground fault circuit interrupter (GFCI). The GFCI senses, for example, a current imbalance between the phase and neutral conductors of the circuit breaker and opens or trips the circuit.

The electronic trip device should be tested periodically to ensure proper operation, however, it is believed that most users of electronic trip devices do not test the devices as recommended. Some users may not be aware of the importance of regular testing, while others may lose track of time between tests or forget to test the units. Even if periodic testing is performed, a failure of the electronic trip device could occur between the tests rendering the electronic trip device inoperable without any indication to the user.

Accordingly, there is a need for a circuit breaker that is capable of monitoring a status of its ground fault protection. Furthermore, there is a need for a circuit breaker that alerts a user and/or discontinues power to the circuit in the event of improper operation of the ground fault protection.

BRIEF DESCRIPTION OF THE INVENTION

In one aspect, an electronic trip device is provided that includes a test signal generator coupled to at least one of a line conductor and a neutral conductor and configured to create a test signal. The electronic trip device also includes a leakage current detection circuit configured to compare a current in the line conductor and a current in the neutral conductor, the leakage current detection circuit configured to output an error signal if the test signal is not detected.

In another aspect, a method for operating an electronic trip device coupled within an electric circuit that includes a line conductor and a neutral conductor is provided. The method includes creating a test signal within at least one of the line conductor and the neutral conductor and measuring a current flow within the electric circuit. The method also includes generating an error signal if the test signal is not detected in the measured current flow.

DETAILED DESCRIPTION OF THE INVENTION

The methods and apparatus described herein facilitate self-testing of a ground fault circuit interrupter (GFCI). Although described herein with respect to a GFCI, the methods and apparatus described herein may also be included within, or used in conjunction with, electronic trip devices, circuit breakers, and/or any other circuit protection devices that include ground fault detection capabilities.

Technical effects of the methods and apparatus described herein include at least one of: (a) creating a test signal within at least one of a line conductor and a neutral conductor; (b) measuring a current flow within the electric circuit; and (c) generating an error signal if the test signal is not detected in the measured current flow.

Figure 1:
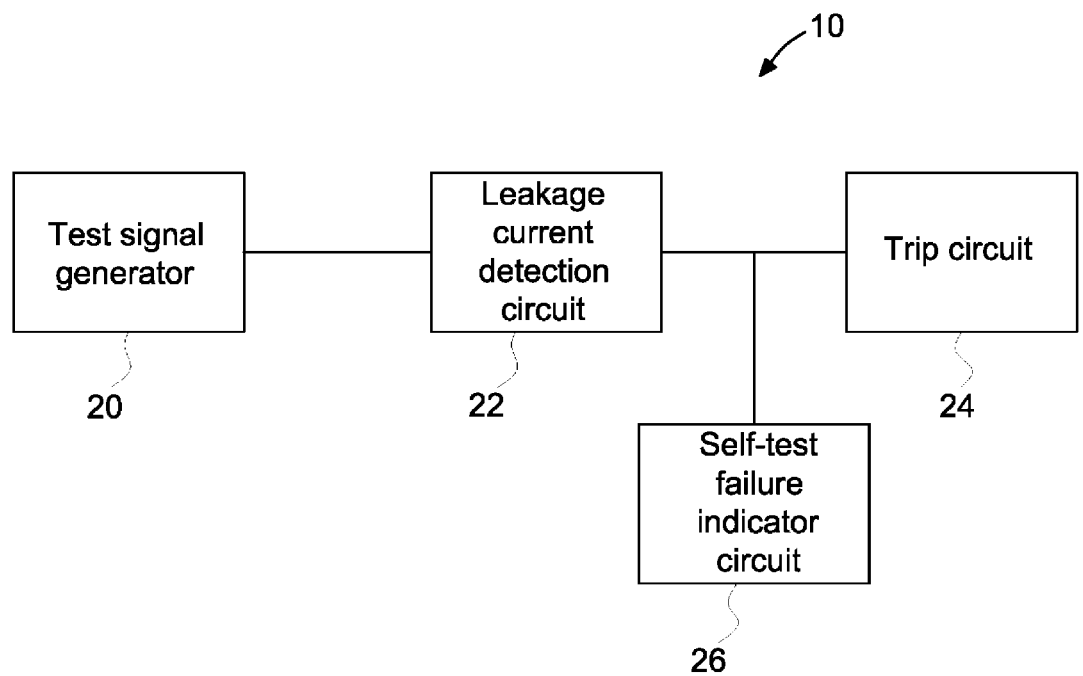
FIG. 1 is a block diagram of an exemplary electronic trip device.

FIG. 1 is block diagram of an exemplary electronic trip device 10. In the exemplary embodiment, electronic trip device 10 includes a test signal generator 20, a leakage current detection circuit 22, and a trip circuit 24. Electronic trip device 10 may also include a self-test failure indicator circuit 26. Electronic trip device 10 is included within a GFCI, which is included within a circuit (not shown in FIG. 1). Electronic trip device 10 facilitates protecting the circuit by interrupting the circuit (i.e., opening the circuit) upon sensing a ground fault condition. Device 10 not only provides protection from a ground fault condition, but also monitors its operation to ensure that device 10 is functioning properly. The monitoring of the operation of device 10, also referred to herein as a self-test, is continuous, intermittent, and/or periodic and does not interfere with the ground fault protection.

Test signal generator 20 creates a test signal. In the exemplary embodiment, test signal generator 20 creates an intentional test leakage current. Test signal generator 20 may also be described as causing the intentional test leakage current. The test leakage current has a known magnitude and is used to self-test device 10. Leakage current detection circuit 22 monitors current flow to detect a ground fault condition. During normal operation of the circuit, a current entering device 10, referred to herein as a line current, from a power source (not shown in FIG. 1) substantially equals the current returned to device 10, referred to herein as a load current, from a load (not shown in FIG. 1). In the event of a ground fault condition, for example, a short from the load to ground (i.e., an unintended path from the load to ground), the load current returned to device 10 is less than the line current entering device 10. Leakage current detection circuit 22 identifies the difference between the load current and the line current, which is referred to herein as a leakage current. Trip circuit 24 opens, uncoupling the power source from the load, if the difference between the load current and the line current is greater than a predefined level. Uncoupling the power source from the load is referred to herein as tripping device 10.

Since, in the exemplary embodiment, test signal generator 20 intentionally creates a difference between the line current and the load current, leakage current detection circuit 22 is configured to cause trip circuit 24 to trip when the difference between the load current and the line current is greater than the known test leakage current. To provide the self-test functionality, leakage current detection circuit 22 is also configured to generate an error signal when the test leakage current is not sensed by leakage current detection circuit 22. Not sensing the test leakage current is an indication that device 10 is not functioning properly. The error signal is provided to at least one of trip circuit 24 and indicator circuit 26. Trip circuit 24 trips in response to the error signal. Indicator circuit 26 provides a user with an indication that the self-test failed. The indication may include, but is not limited to, a visual indication (e.g., an illuminated LED) and/or an audio indication (e.g., sounding an alarm).

In an alternative embodiment, test signal generator 20 generates a high-frequency leakage current and applies it to at least one of a line conductor and a neutral conductor within the circuit that device 10 is protecting. The line current is provided by the power source at a known frequency, for example, typically 60 Hz in the United States, and 50 Hz in other parts of the world. The load current is returned at a frequency equal to that of the line current. Test signal generator 20 generates the high-frequency leakage current at a frequency higher than the line current. Leakage current detection circuit 22 distinguishes between the high-frequency test current and the line current, for example, by including a low-pass filter, and therefore, the high-frequency leakage current does not interfere with normal operation of leakage current detection circuit 22. In the alternative embodiment, leakage current detection circuit 22 is configured to cause trip circuit 24 to trip when the difference between the load current and the line current is greater than a predefined level. To provide the self-test functionality, leakage current detection circuit 22 is also configured to generate an error signal when the high-frequency leakage current is not detected by leakage current detection circuit 22. Not sensing the high-frequency leakage current is an indication that device 10 is not functioning properly. As described above, the error signal may be provided to one or more of trip circuit 24 and indicator circuit 26.

Figure 2:
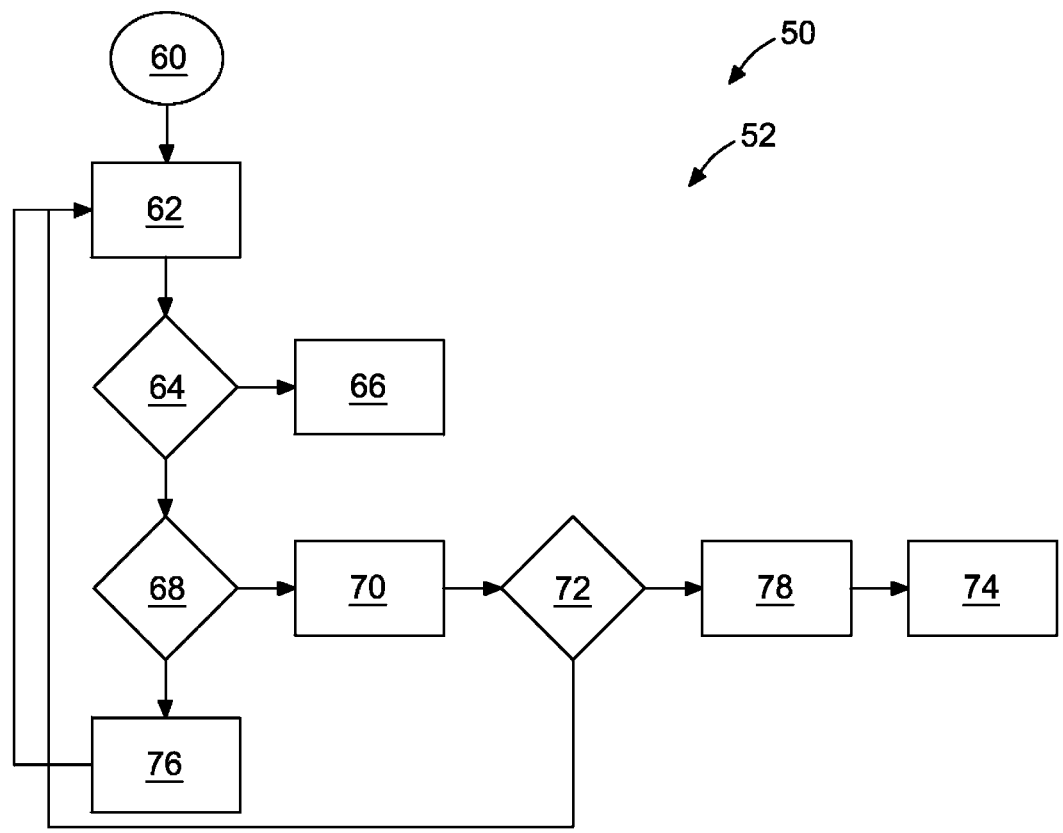
FIG. 2 is a flow chart of an exemplary method for controlling the electronic trip device shown in FIG. 1.

FIG. 2 is a flow chart 50 of an exemplary method 52 for controlling an electronic trip device, for example, electronic trip device 10 (shown in FIG. 1). Method 52 includes creating 60 a test signal within at least one of a line conductor and a neutral conductor. In the exemplary embodiment, a test signal generator, for example, test signal generator 20 (shown in FIG. 1) creates 60 a test leakage current having a known magnitude and applies the test leakage current to at least one of the line conductor and the neutral conductor. In an alternative embodiment, test signal generator 20 creates 60 a high-frequency leakage current and applies the high-frequency leakage current to at least one of the line conductor and the neutral conductor. Method 52 also includes measuring 62 a leakage current. Device 10 measures 62 a leakage current by measuring a difference between a current entering device 10 and a current returning to device 10 from the load. Method 52 also includes determining 64 whether the measured 62 leakage current is higher than a predefined threshold. For example, leakage current detection circuit 22 determines 64 whether the difference between the current entering device 10 and the current returning to device 10 from the load is higher than the predefined threshold. The predefined threshold corresponds to a leakage current associated with a ground fault condition.

In the exemplary embodiment, the current entering device 10 includes a line current from the power source and the current returning to device 10 from the load includes the line current minus the test leakage current and any other leakage current. In the exemplary embodiment, the predefined threshold is a leakage current level that corresponds to a ground fault condition plus the test leakage current. In other words, the predefined threshold is greater than the magnitude of the applied test leakage current. In the alternative embodiment, which includes creating 60 the high-frequency test leakage current, the predefined threshold does not include the intentionally added test leakage current and therefore is lower than the predefined threshold used in the exemplary embodiment.

In both the exemplary embodiment and the alternative embodiment, method 52 includes tripping 66 device 10 if the leakage current detection circuit 22 determines that the measured 62 leakage current is higher than the predefined threshold. If leakage current is greater than the predefined threshold, a ground fault condition is present and device 10 trips 66.

Method 52 also includes detecting 68 the test signal. Detecting 68 the test signal facilitates self-testing of device 10. In the exemplary embodiment, detecting 68 the test signal includes determining whether the measured 62 leakage current is lower than the magnitude of the applied test leakage current. Not sensing the test leakage current is an indication that device 10 is not functioning properly. Continuously monitoring whether the test leakage current is detected 68 provides device 10 with self-test functionality. In the alternative embodiment, detecting 68 the test signal includes detecting the high-frequency test current. For example, leakage current detection circuit 22 detects 68 the high-frequency test current. Notability, detecting 68 the test signal does not interfere with normal leakage current detection performed by leakage current detection circuit 22.

Method 52 may also include incrementing 70 a timer if the test signal is not detected 68. For example, if leakage current detection circuit 22 does not detect the test signal, a timer within device 10 is incremented. Method 52 also includes determining 72 if the timer has exceeded a predefined time limit. The predefined time limit is a time period that is shorter than a detection time period. The detection time period is a length of time that device 10 has to identify a problem. For example, if a criteria for proper self-testing is that device 10 detects an issue within five seconds, the timer's predefined time limit would be less than or equal to five seconds. Five seconds is included as an example only, and the predefined time limit may be any other time limit that allows device 10 to function as described herein. Incrementing 70 a timer and determining 72 if the timer has exceeded the predefined time limit prevents generating the error signal when a quick fluctuation in leakage current, where the test signal is not detected, is measured by leakage current detection circuit 22. Such a fluctuation is typically a false indication of an improperly operating device 10. Furthermore, the predefined time limit is longer than fluctuations naturally present in an AC signal. Setting the predefined time limit longer than these fluctuations (e.g., greater than ½ cycle, for example, approximately 10 ms at 50 Hz or 8.33 ms at 60 Hz) facilitates preventing tripping caused by naturally occurring AC fluctuations.

Method 52 also includes generating 74 an error signal. For example, if leakage current detection circuit 22 determines 72 the timer has exceeded the predefined time limit, an error signal is generated 74. The error signal is provided to at least one of a trip device, for example, trip circuit 24 (shown in FIG. 1) and a notification device, for example, indicator circuit 26 (shown in FIG. 1). Upon receipt of the error signal, trip circuit 24 is activated to disconnect the load from the power source. Upon receipt of the error signal, indicator circuit 26 provides a user with an indication of the failed self-test. If leakage current detection circuit 22 determines 72 that the timer has not exceeded the predefined time limit, method 52 returns to measuring 62 leakage current. The steps of method 52 are performed continuously and substantially instantaneously.

Method 52 further includes resetting 76 the timer if the test signal is detected. For example, if leakage current detection circuit 22 detects 68 the test signal, the timer is reset. Detecting the test signal is an indication that device 10 is functioning properly.

In at least some embodiments, method 52 may also include providing 78 an indication that device 10 has tripped because the self-test timer exceeded the predefined time limit. For example, if leakage current detection circuit 22 does not detect 68 the test signal, and determines 72 the timer has exceeded the predefined time limit, expiration of the self-test timer may be stored in a memory, displayed visually, and/or indicated by generating an audio signal, for example, by indicator circuit 26. Providing 78 the indication that the self-test timer has exceeded the predefined time limit provides an indication that a potential problem with device 10 caused device 10 to trip, rather than the presence of a ground fault condition.

Figure 3:
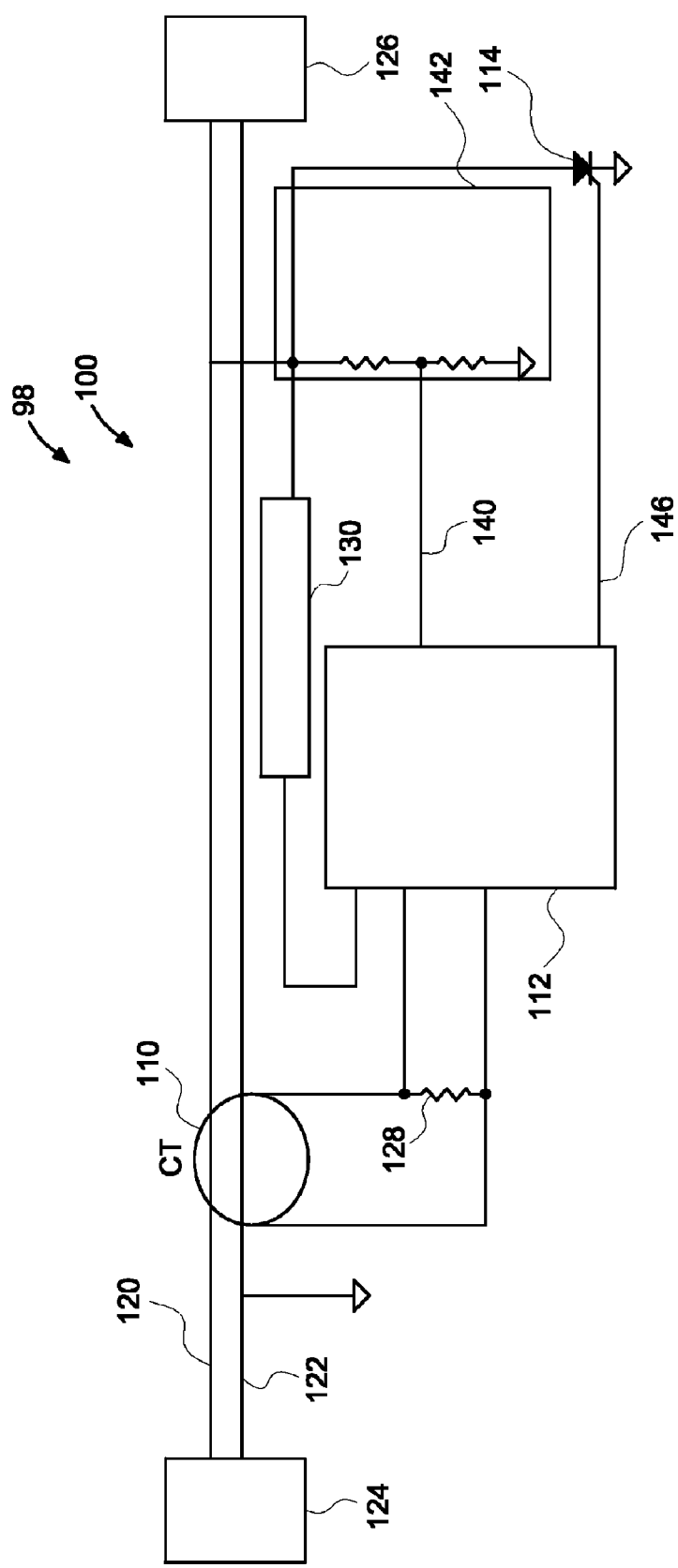
FIG. 3 is a schematic diagram of a first circuit suitable for use in the exemplary embodiment of the electronic trip device shown in FIG. 1.

FIG. 3 is a schematic diagram 98 of a first circuit 100 suitable for use in electronic trip device 10 (shown in FIG. 1). For example, first circuit 100 is suitable for use in the exemplary embodiment of device 10, wherein a test leakage current having a known magnitude is created within device 10. First circuit 100 includes a current sense transformer 110, a processor 112, and a silicon controlled rectifier (SCR) 114. First circuit 100 may also include signal conditioning circuitry that facilitates operation of first circuit 100 as described herein. The term processor, as used herein, refers to central processing units, microprocessors, microcontrollers, reduced instruction set circuits (RISC), application specific integrated circuits (ASIC), logic circuits, and any other circuit or processor capable of executing the functions described herein. A line conductor 120 and a neutral conductor 122 couple a power source 124 to a load 126. Sense transformer 110 measures a difference between a current in line conductor 120 and a current in neutral conductor 122. The difference is also referred to herein as a leakage current. If the current in line conductor 120 is equal to the current in neutral conductor 122, the two currents cancel, and sense transformer 110 does not output a current. If the current in line conductor 120 is higher than the current in neutral conductor 122, sense transformer 110 provides a current that is applied across a resistor 128. Processor 112 is configured to measure a voltage drop across resistor 128. Processor 112 is programmed to convert the measured voltage drop to a leakage current measurement.

Processor 112 is powered by a power supply 130. Power supply 130 receives power from line conductor 120 and conditions the power for use by processor 112. Processor 112 also receives a line voltage signal 140 that is adjusted by a resistor network 142.

As described above with respect to FIG. 1, in the exemplary embodiment, a test leakage current is created within device 10 and measured in order to conduct a self-test of device 10. In first circuit 100, test signal generator 20 (shown in FIG. 1) includes power supply 130, processor 112, and resistor network 142. First circuit 100 is configured to consume a known power, the power consumption thereby establishing the known test leakage current (i.e., the test signal). Moreover, the power consumed by device 10 and/or any portion of device 10 may establish the known test leakage current. Since power supply 130 receives power from line conductor 120 on the load side of sense transformer 110, the current returned through sense transformer 110 in neutral conductor 122 will be less than the current entering sense transformer 110 through line conductor 120. The difference between the current entering sense transformer 110 through line conductor 120 and the current returned through sense transformer 110 in neutral conductor 122 caused by the power consumption of circuit 100 is referred to herein as the known test leakage current.

Furthermore, a value corresponding to the known test leakage current may be stored in processor 112 as a lower predefined threshold. Moreover, the stored lower predefined threshold may be adjusted based at least partially on the line voltage. For example, if the line voltage is increased, the known test leakage current will also increase. By adjusting the known test leakage current based on the line voltage, the known test leakage current will more accurately represent the test leakage current created within device 10. Adjusting the known test leakage current may include calculating a new test leakage current based on the measured line voltage and a stored line voltage, accessing a stored table of known test leakage current values that correspond to various measured line voltages, and/or any other technique that allows device 10 to function as described herein.

Processor 112 is programmed to provide an SCR trigger signal 146 to SCR 114 when the leakage current measured by processor 112 is larger than a predefined ground fault current level plus the lower predefined threshold. The predefined ground fault current level is a level of leakage current determined to be an indication of the presence of a ground fault condition. A leakage current larger than the predefined ground fault current level plus the lower predefined threshold is an indication that a ground fault condition is present. By not providing SCR trigger signal 146 unless the leakage current measured by processor 112 is larger than the ground fault level plus the lower predefined threshold, SCR 114 will not be triggered unless the leakage current that is not intentionally created is above the predefined ground fault current level. Although not shown in FIG. 3, SCR 114 is coupled to a known solenoid or circuit breaker, and triggering SCR 114 causes the solenoid or circuit breaker to open, disconnecting power source 124 from load 126 and providing protection from the ground fault condition.

Moreover, processor 112 is programmed to provide an SCR trigger signal 146 to SCR 114 when the leakage current measured by processor 112 is less than the predefined threshold. Not sensing at least the intentionally created test leakage current is an indication that device 10 is not functioning properly. In an alternative embodiment, SCR trigger signal 146 may be provided to a notification device, for example, indicator circuit 26 (shown in FIG. 1) to alert a user to the failed self-test.

Figure 4:
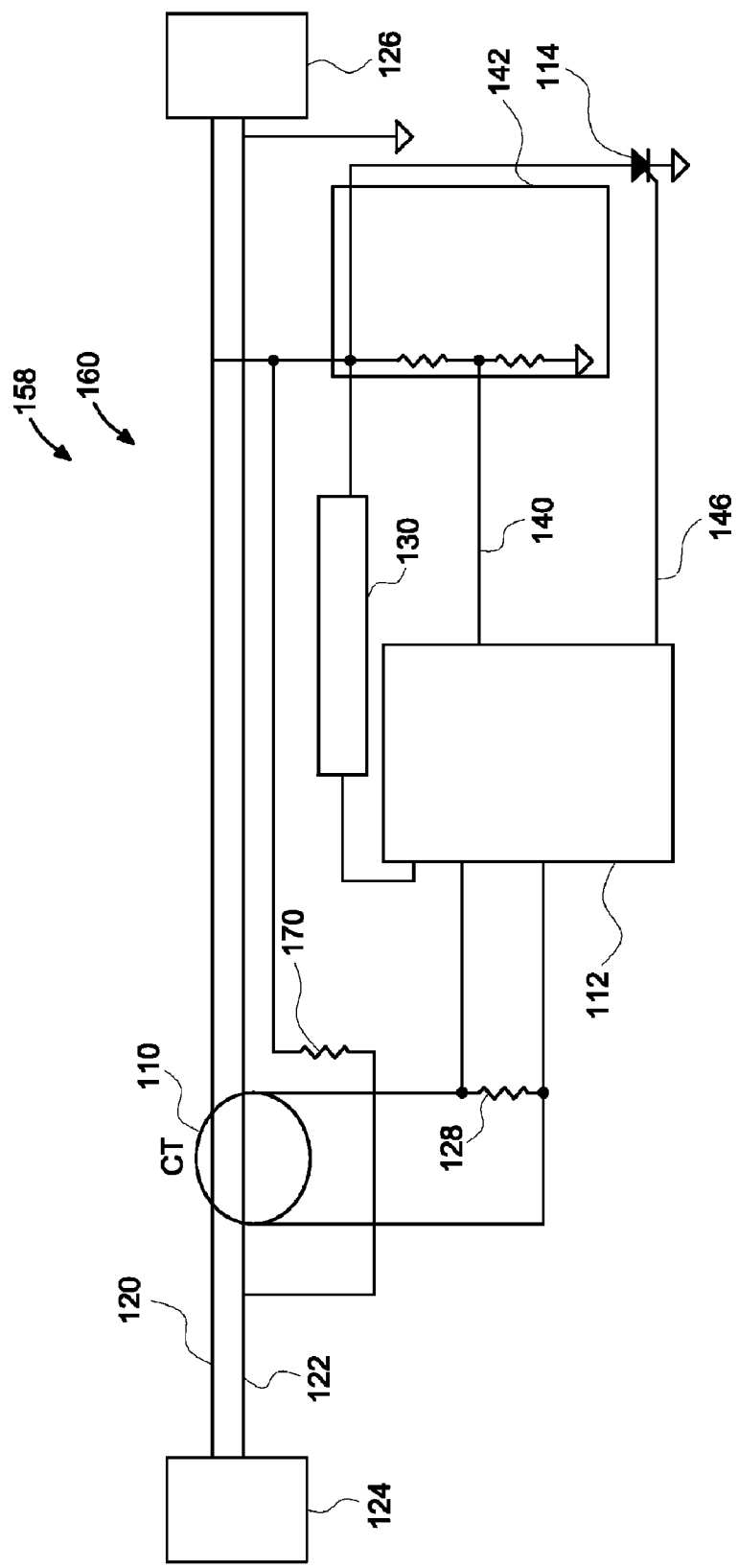
FIG. 4 is a schematic diagram of a second circuit suitable for use in the exemplary embodiment of the electronic trip device shown in FIG. 1.

FIG. 4 is a schematic diagram 158 of a second circuit 160 suitable for use in electronic trip device 10 (shown in FIG. 1). Components included within first circuit 100 and also within second circuit 160 are identified with identical reference numerals. Second circuit 160 is suitable for use in the exemplary embodiment of device 10, wherein a test leakage current having a known magnitude is created. In contrast to first circuit 100, test signal generator 20 in second circuit 160 includes a constant current source 170 coupled between line conductor 120 and neutral conductor 122. Constant current source 170 may include a resistor, a current mirror, or any other component or device that allows second circuit 160 to function as described herein. For example, a resistor value for a resistor used to form constant current source 170 is selected to generate a desired test leakage current. Constant current source 170 creates a bypass around sense transformer 110, creating the known test leakage current. Current entering sense transformer 110 will be a known amount higher than current returning through sense transformer 110 since some current enters sense transformer 110 but returns to power source 124 through constant current source 170.

Figure 5:
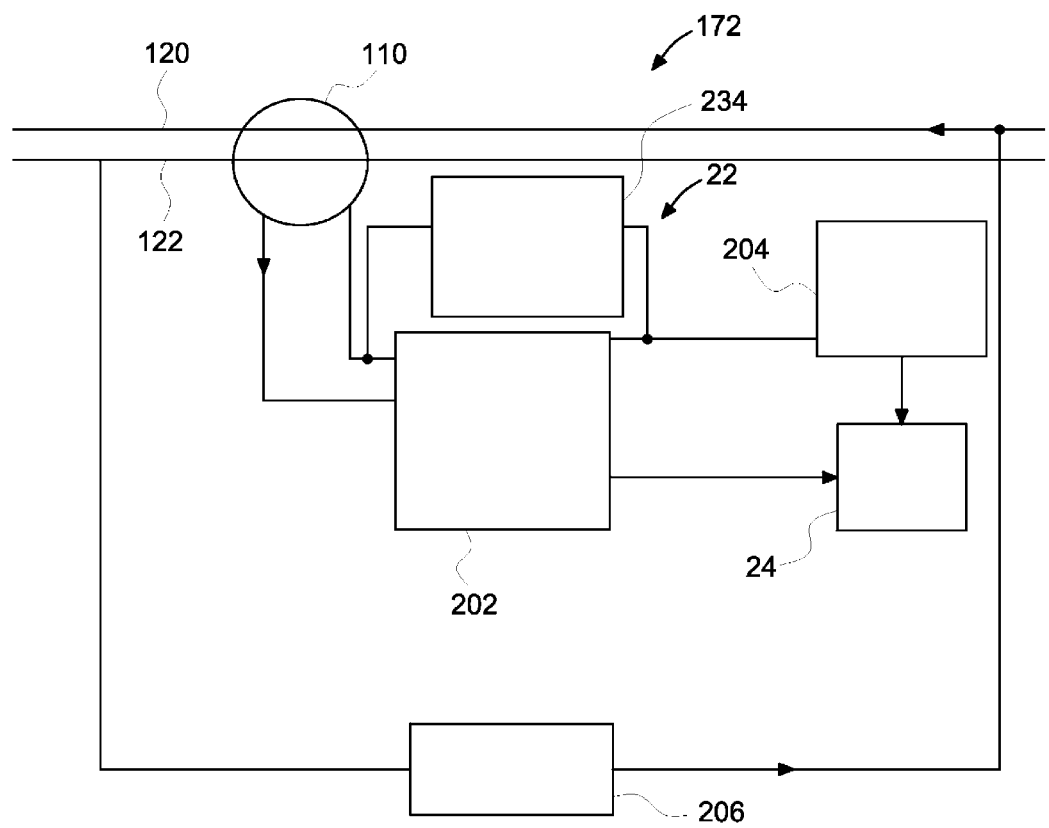
FIG. 5 is a block diagram of an analog implementation of the exemplary embodiment of the electronic trip device shown in FIG. 1.
Figure 6:
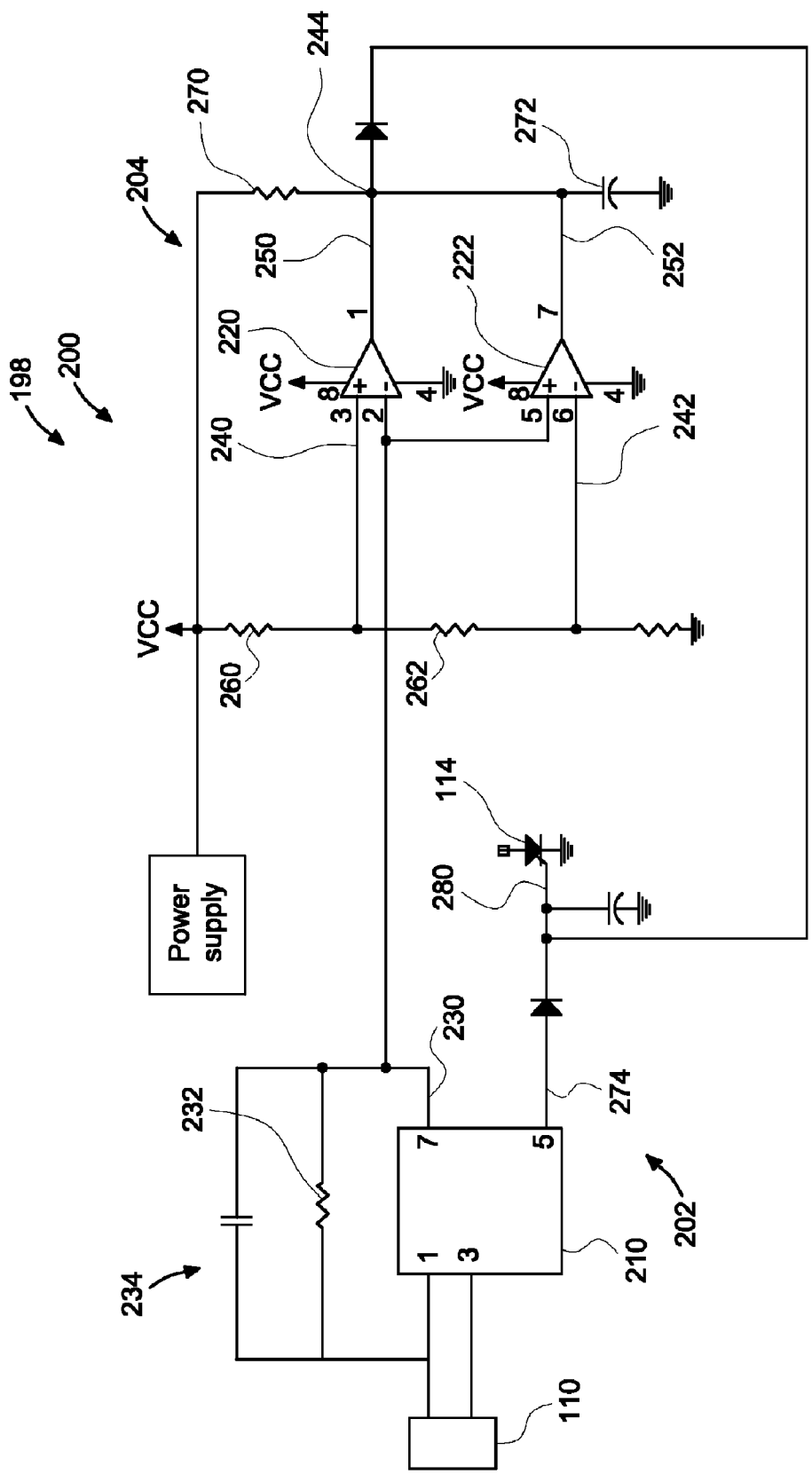
FIG. 6 is a schematic diagram of a third circuit suitable for use in the exemplary embodiment of the electronic trip device shown in FIG. 1.
Figure 7:
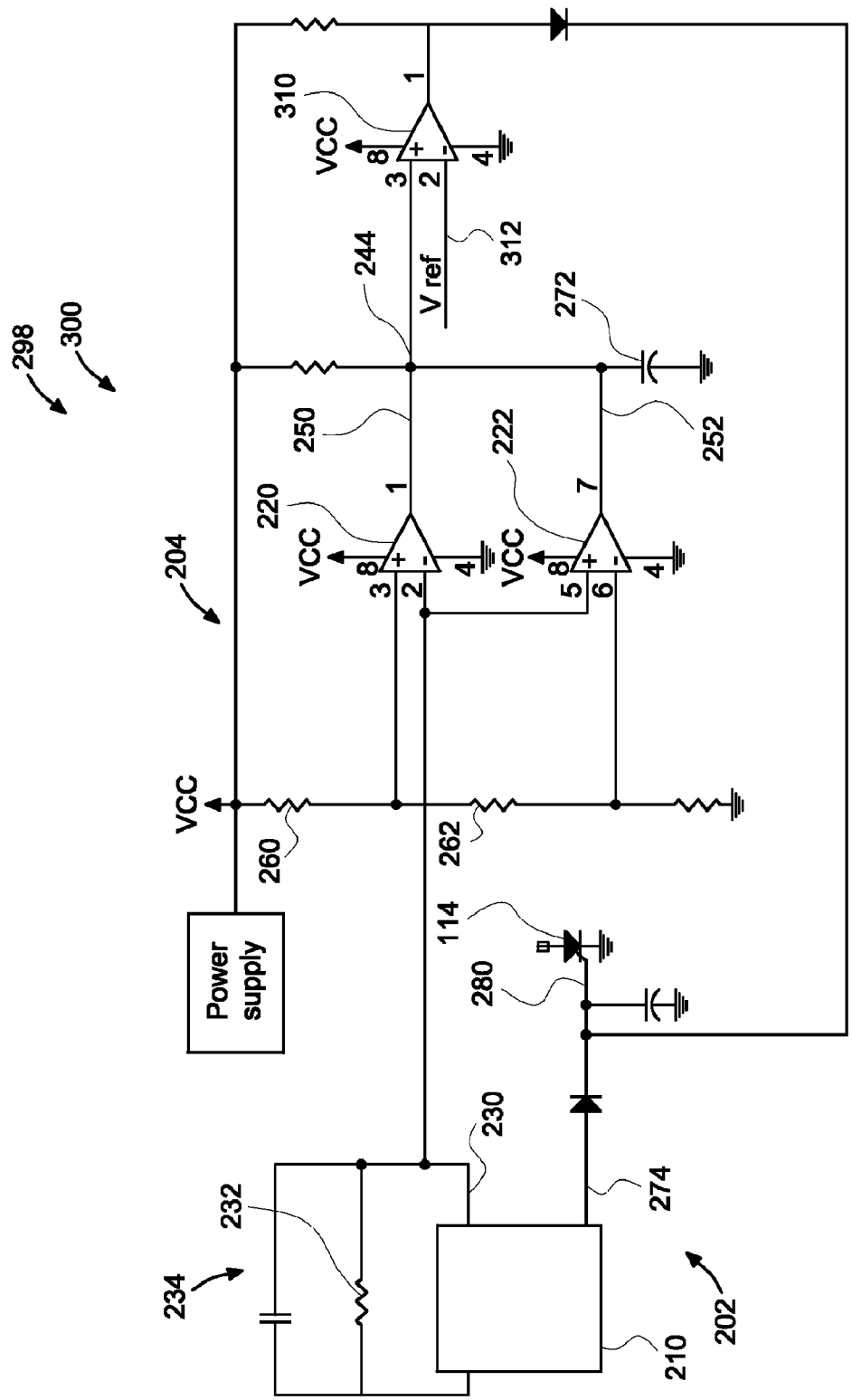
FIG. 7 is a schematic diagram of a fourth circuit suitable for use in the exemplary embodiment of the electronic trip device shown in FIG. 1.

FIGS. 5, 6, and 7 show examples of analog implementations of the exemplary embodiment of electronic trip device 10 (shown in FIG. 1). FIG. 5 is a block diagram 172 of an analog implementation of the exemplary embodiment of electronic trip device 10. FIG. 6 is a schematic diagram 198 of a third circuit 200 suitable for use in electronic trip device 10, and more specifically, third circuit 200 is a specific circuit that achieves the functions described in block diagram 172. FIG. 7 is a schematic diagram 298 of a fourth circuit 300 suitable for use in electronic trip device 10, and more specifically, fourth circuit 300 is a specific circuit that achieves the functions described in block diagram 172. For example, third circuit 200 and fourth circuit 300 are suitable for use in the exemplary embodiment of device 10, wherein a test leakage current having a known magnitude is created within device 10. Third circuit 200 includes sense transformer 110, leakage current detection circuit 22, and trip circuit 24. Furthermore, leakage current detection circuit 22 includes a ground fault circuit interrupter (GFCI) detection circuit 202 and a test leakage current detection circuit 204. In third circuit 200, test signal generator 20 includes a test leakage current generator 206. For example, test leakage current generator 206 may include a current generator, or may include a component or components that cause a known leakage current to be drawn from line conductor 120 and/or neutral conductor 122. Test leakage current generator 206 may include GFCI detection circuit 202, which consumes a known amount of power, drawn from line conductor 120.

Referring now to FIG. 6, GFCI detection circuit 202 includes a ground fault interrupter 210, for example, but not limited to, an RV4145 controller or a FAN4147 ground fault interrupter manufactured by Fairchild Semiconductor of South Portland, Me., USA. Sense transformer 110 is coupled to ground fault interrupter 210. Third circuit 200 also includes test leakage current detection circuit 204 that includes a first voltage comparator 220 and a second voltage comparator 222.

A known test leakage current is created within third circuit 200 by test leakage current generator 206 (shown in FIG. 5). Ground fault interrupter 210 outputs a voltage measurement ($V_7$) 230, for example, at pin 7 of an RV4145. The voltage measurement 230 is the RMS voltage at pin 7 relative to pin 3 ($V_{REF}$). Typically, $V_{REF}$=+13 Volts. For example, voltage measurement 230 may be determined by: $V_7 = R_{SENSE} \times I_{SENSE}/N$, wherein $R_{SENSE}$ is a value of a resistor 232 included within a feedback path 234 connected from pin 7 to pin 1, $I_{SENSE}$ is the leakage current sensed by sense transformer 110, and N is a turns ratio of sense transformer 110. A value of resistor 232 is selected to set $I_{SENSE}$ at a threshold leakage current equal to a current corresponding to the presence of a ground fault condition plus the level of known test leakage current. This ensures circuit 200 will cause a trip when the measured leakage current is greater than a ground fault current plus the intentionally added test leakage current.

Test leakage current detection circuit 204 determines whether voltage measurement 230 corresponds to the presence of the known test leakage current. When leakage current is not sensed, voltage measurement 230 is a substantially DC signal. In the example of an RV4145, voltage measurement 230 is ½ Vcc when leakage current is not sensed. When leakage current is sensed, the leakage current is coupled onto voltage measurement 230 and as the leakage current increases, voltage measurement 230 becomes increasingly sinusoidal. First voltage comparator 220 and second voltage comparator 222 compare voltage measurement 230 to a first voltage reference 240 and a second voltage reference 242. A combined output 244 of voltage comparators 220 and 222 is high when the test leakage current is not sensed. An output 250 of first voltage comparator 220 is high when voltage measurement 230 is lower than first voltage reference 240 and an output 252 of second voltage comparator 222 is high when voltage measurement 230 is higher than second voltage reference 242. For example, first voltage reference 240 may be a high voltage reference, determined such that output 250 of first voltage comparator 220 is high when voltage measurement 230 is less than first voltage reference 240. Second voltage reference 242 may be a low voltage reference, determined such that output 252 of second voltage comparator 222 is high when voltage measurement 230 is greater than second voltage reference 242. More specifically, in a specific example, output 252 is high when voltage measurement 230 is less negative than second voltage reference 242. Values for a first resistor 260 and a second resistor 262 are selected to provide first voltage reference 240 and second voltage reference 242. For example, values for first resistor 260 and second resistor 262 are selected such that voltage measurement 230 crosses over first voltage reference 240 and second voltage reference 242. If second voltage reference 242 is too high, then even when voltage measurement 230 corresponds to no leakage current, output 244 would correspond to the presence of the test leakage current.

Output 250 and output 252 are coupled to generate combined output 244 and coupled to Vcc through a pull-up resistor 270. A capacitor 272 creates an RC time constant, which may be adjusted, for example, to conform with UL requirements. In the exemplary embodiment, output 244 is coupled to an SCR trigger output 274 (e.g., pin 5) of ground fault interrupter 210 to create a diode OR between these signals. A final output 280 will go high if the test leakage current is not sensed (i.e., output 244 is high) or if ground fault interrupter 210 identified a leakage current that exceeds a threshold that corresponds to the presence of a ground fault condition. Final output 280 is coupled to SCR 114. In an alternative embodiment, output 244 may be provided to a redundant SCR (not shown in FIG. 6) or a transistor (not shown in FIG. 6) configured to trip a circuit protection device, and/or a notification device, for example indicator circuit 26 (shown in FIG. 1).

As described above, FIG. 7 is a schematic diagram of fourth circuit 300 suitable for use in electronic trip device 10 (shown in FIG. 1). Components included within third circuit 200 and also within fourth circuit 300 are identified with identical reference numerals. Fourth circuit 300 is suitable for use in the exemplary embodiment of device 10, wherein a test leakage current having a known magnitude is created within device 10. In addition to the components included in third circuit 200, fourth circuit 300 also includes a third voltage comparator 310. In order for fourth circuit 300 to provide a signal indicating that no leakage current is sensed (i.e., the test leakage current is not sensed), output 244 is compared to a third reference voltage 312. Third voltage comparator 310 provides an additional level of precision when compared to third circuit 200.

Figure 8:
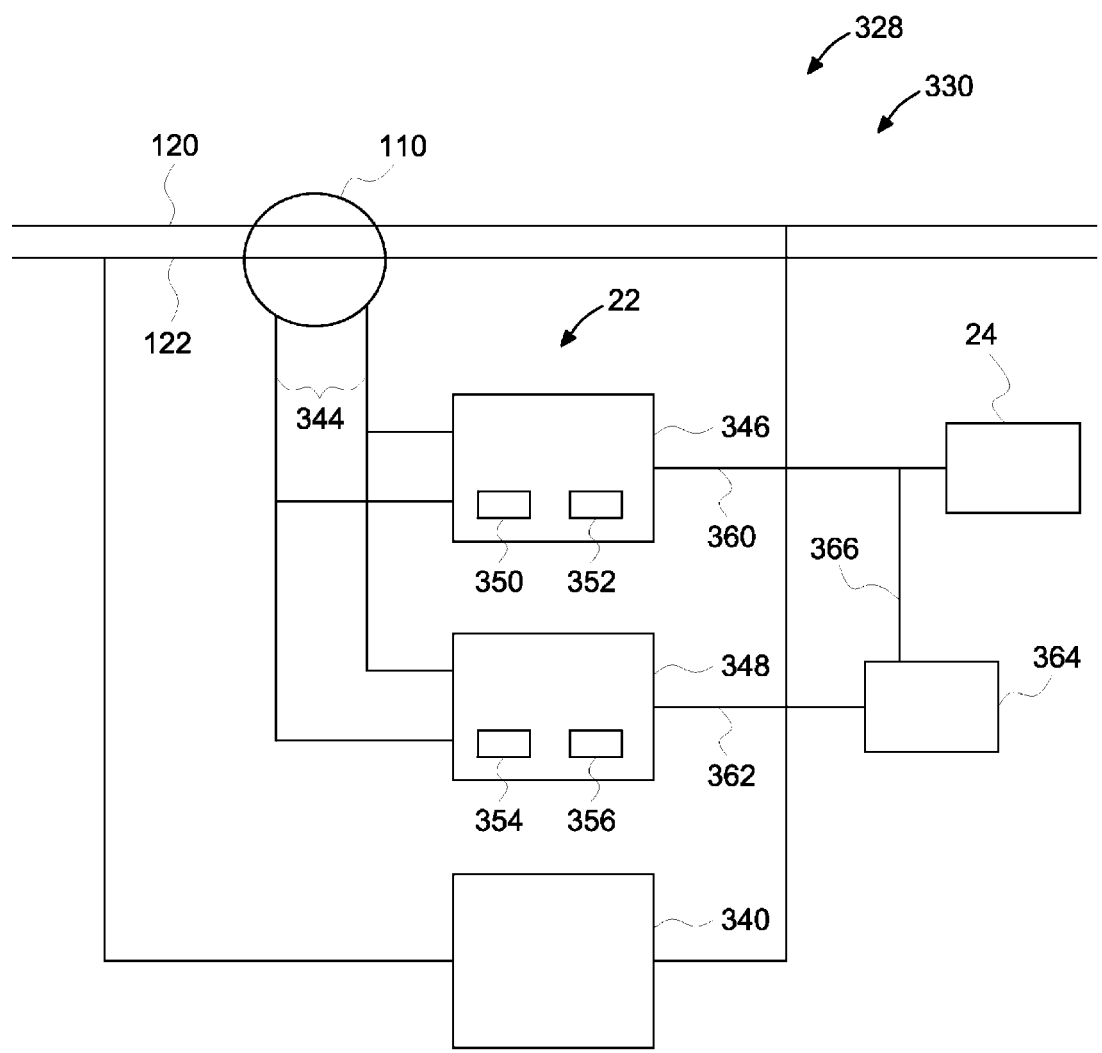
FIG. 8 is a block diagram of a fifth circuit suitable for use in the alternative embodiment of the electronic trip device shown in FIG. 1.
Figure 9:
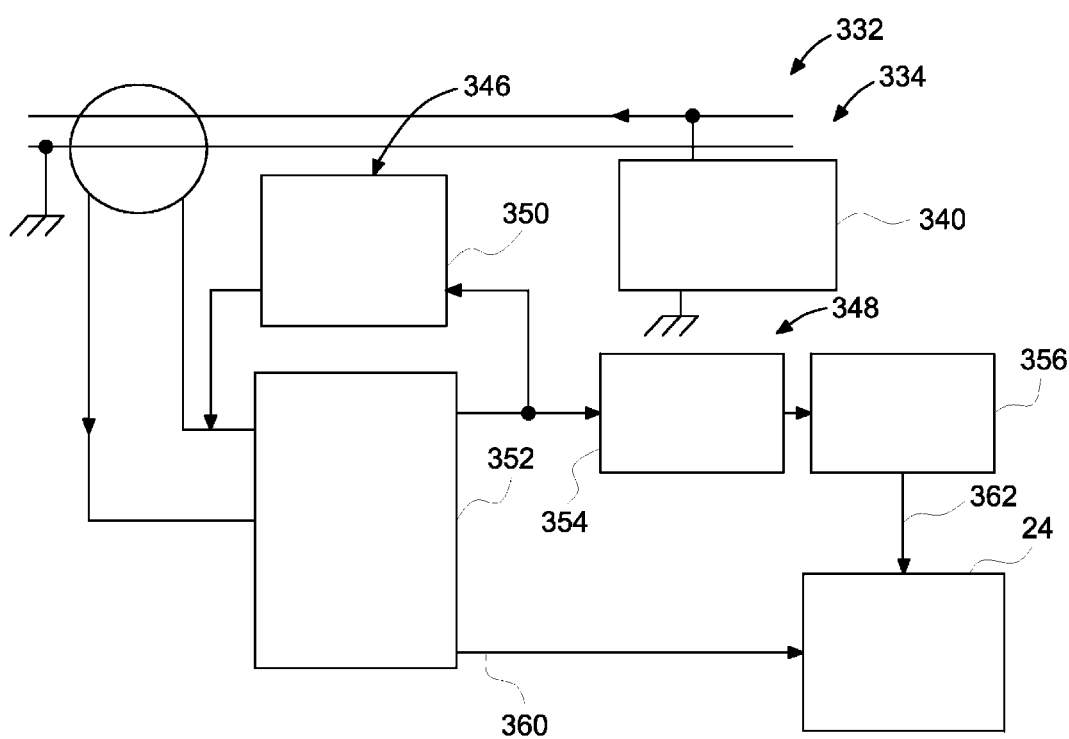
FIG. 9 is a block diagram of a sixth circuit suitable for use in the alternative embodiment of the electronic trip device shown in FIG. 1.

FIG. 8 is a block diagram 328 of a fifth circuit 330 suitable for use in electronic trip device 10 (shown in FIG. 1). For example, fifth circuit 330 is suitable for use in the alternative embodiment of device 10, wherein a high-frequency test signal is created within device 10. FIG. 9 is a block diagram 332 of a sixth circuit 334 suitable for use in electronic trip device 10 (shown in FIG. 1). Sixth circuit 334 is an analog implementation used to achieve the functions of the alternative embodiment of electronic trip device 10, described above.

Referring now to FIG. 8, in fifth circuit 330, test signal generator 20 includes a high-frequency current source 340. High-frequency current source 340 injects a high-frequency current onto line conductor 120 and/or neutral conductor 122. Leakage current detection circuit 22 includes a low pass filter circuit 346 and a high pass filter circuit 348. An output 344 of sense transformer 110 is input to low pass filter circuit 346 and to high pass filter circuit 348. Low pass filter circuit 346 includes a low pass filter 350 and a GFCI detection circuit 352. High pass filter circuit 348 includes a high pass filter 354 and a high-frequency test signal detection circuit 356. High pass filter circuit 348 and low pass filter circuit 346 may be included within a microprocessor, composed of discrete components, and/or any other combination of digital and analog electronics.

High-frequency current source 340 generates the high-frequency leakage current at a frequency higher than the line current. Low pass filter circuit 346 further includes an output 360. Low pass filter 350 prevents high-frequency signals from interfering with operation of GFCI detection circuit 352. For example, low pass filter circuit 346 may include a typical ground fault protection circuit, with the addition of low pass filter 350. Low pass filter circuit 346 is configured to cause trip circuit 24 to trip when the difference between the load current, and the line current is greater than a predefined level that corresponds to a ground fault condition. For example, if the difference between the load current and the line current is greater than the predefined level, output 360 is high, which causes trip circuit 24 to trip.

To provide the self-test functionality, leakage current detection circuit 22 is also configured to cause trip circuit 24 to trip, and/or to cause indicator circuit 26 to indicate a failed self-test, when the high-frequency leakage current is not detected. High pass filter circuit 348 further includes an output 362. High pass filter circuit 348 is configured such that output 362 is low when high frequency test signal detection circuit 356 does not detect the high-frequency test signal. This indicates a fault within circuit 330. Output 362 is inverted by an inverter 364, such that an output 366 of inverter 364 is high when a fault is detected within circuit 330. Not sensing the high-frequency leakage current is an indication that device 10 is not functioning properly. Output 360 and output 366 are connected in a logical OR configuration, where trip circuit 24 will trip when either output 360 is high or when output 366 is high.

Components included within fifth circuit 330 (shown in FIG. 8) and also within sixth circuit 334 (shown in FIG. 9) are identified with identical reference numerals. Referring now to FIG. 9, sixth circuit 334 is an analog implementation of the alternative embodiment of electronic trip device 10. Low pass filter circuit 346 includes low pass filter 350 and GFCI detection circuit 352. GFCI detection circuit 352 includes ground fault interrupter 210, for example, an RV4145 controller (shown in FIG. 5). Low pass filter 350 prevents high-frequency signals from interfering with operation of GFCI detection circuit 352. For example, low pass filter circuit 346 may include a typical ground fault protection circuit, with the addition of low pass filter 350. Low pass filter circuit 346 is configured to cause trip circuit 24 to trip when the difference between the load current and the line current is greater than a predefined level that corresponds to a ground fault condition. For example, if the difference between the load current and the line current is greater than the predefined level, output 360 is high, which causes trip circuit 24 to trip.

To provide the self-test functionality, leakage current detection circuit 22 is also configured to cause trip circuit 24 to trip when the high-frequency leakage current is not detected. High pass filter circuit 348 is coupled to an output of GFCI detection circuit 352, for example, $V_7$ (shown in FIG. 6) and further includes an output 362. High pass filter circuit 348 is configured such that output 362 is low when high frequency test signal detection circuit 356 does not detect the high-frequency test signal. This indicates a fault within circuit 334. Not sensing the high-frequency leakage current is an indication that device 10 is not functioning properly. Trip circuit 24 is configured to trip when either output 360 is high or when output 362 is low.

Figure 10:
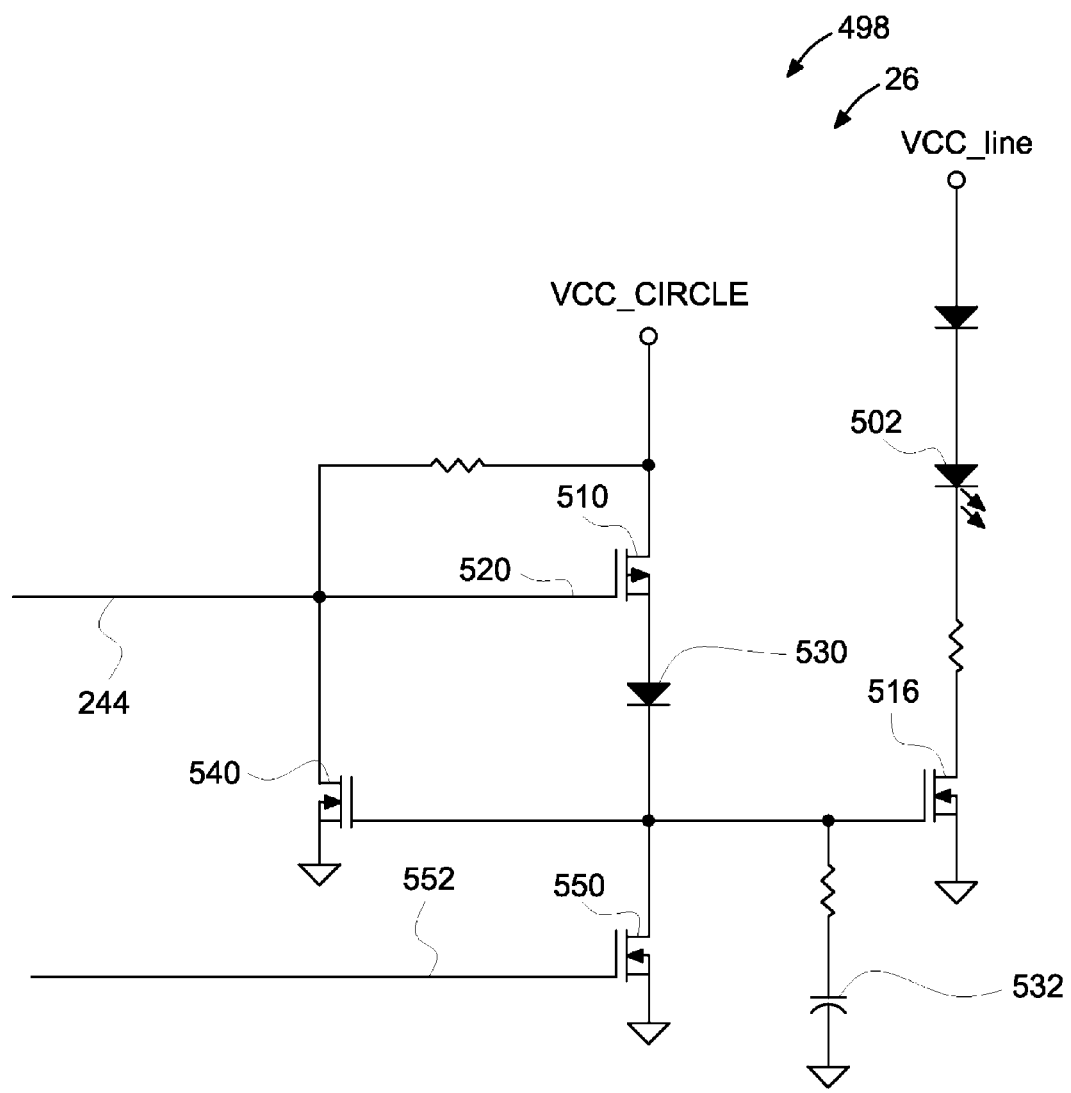
FIG. 10 is a schematic diagram of an exemplary self-test failure indicator circuit that may be included in the electronic trip device shown in FIG. 1.

FIG. 10 is a schematic diagram 498 of an exemplary embodiment of self-test failure indicator circuit 26 (shown in FIG. 1), which may be included in electronic trip device 10 (shown in FIG. 1). In the exemplary embodiment, self-test failure indicator circuit 26 includes a self-test failure indicator 502. Self-test failure indicator 502 may be a light emitting diode (LED), a buzzer, or any other output device that provides an indication of a failed self-test. For example, an LED included within indicator circuit 26 may be lit upon receipt of the error signal from leakage current detection circuit 22.

Furthermore, the circuits described above receive operating power from line conductor 120. Once trip circuit 24 trips, a circuit including line conductor 120 and neutral conductor 122 is interrupted (i.e., opened), and therefore, the circuits described above no longer receive operating power. Therefore, typically, after trip circuit 24 is tripped, operating power for self-test failure indicator 502 is not available from a power source, for example power source 124 (shown in FIG. 3).

Self-test failure indicator circuit 26 includes a first transistor 510 and a second transistor 516. In the exemplary embodiment, transistors 510 and 516 are metal-oxide-semiconductor field-effect transistors (MOSFET), although, any other type of transistor that allows self-test failure indicator circuit 26 to function as described herein may also be used. Upon failing a self-test, for example, after output 244 (shown in FIG. 6) is high, gate 520 of transistor 510 is pulled low, which turns transistor 510 on. Voltage is passed through a first diode 530, charging a first capacitor 532. Once first capacitor 532 has charged, second transistor 516 turns on. Energy discharged from first capacitor 532 powers self-test failure indicator 502. Self-test failure indicator circuit 26 facilitates providing a user with an indication that a failed self-test, rather than a detected ground fault condition, was the cause of the trip. Self-test failure indicator circuit 26 is designed to have high impedance in order to hold charge on first capacitor 532 long enough for a user to receive the indication from self-test failure indicator 502. For example, self-test failure indicator circuit 26 may be configured to light an LED for approximately an hour after a failed self-test causes trip circuit 24 to trip.

In at least some embodiments, self-test failure indicator circuit 26 also includes a third transistor 540. When first capacitor 532 has stored charge, second transistor 516 and third transistor 540 will be on. With third transistor 540 on, gate 520 of first transistor 510 is held low, latching the self-test failure signal.

Furthermore, in at least some embodiments, self-test failure indicator circuit 26 also includes a fourth transistor 550. Fourth transistor 550 facilitates resetting self-test failure indicator circuit 26. When a reset signal is received at gate 552 of fourth transistor 550, fourth transistor 550 is turned on, discharging first capacitor 532, which removes power from self-test failure indicator 502.

Figure 11:
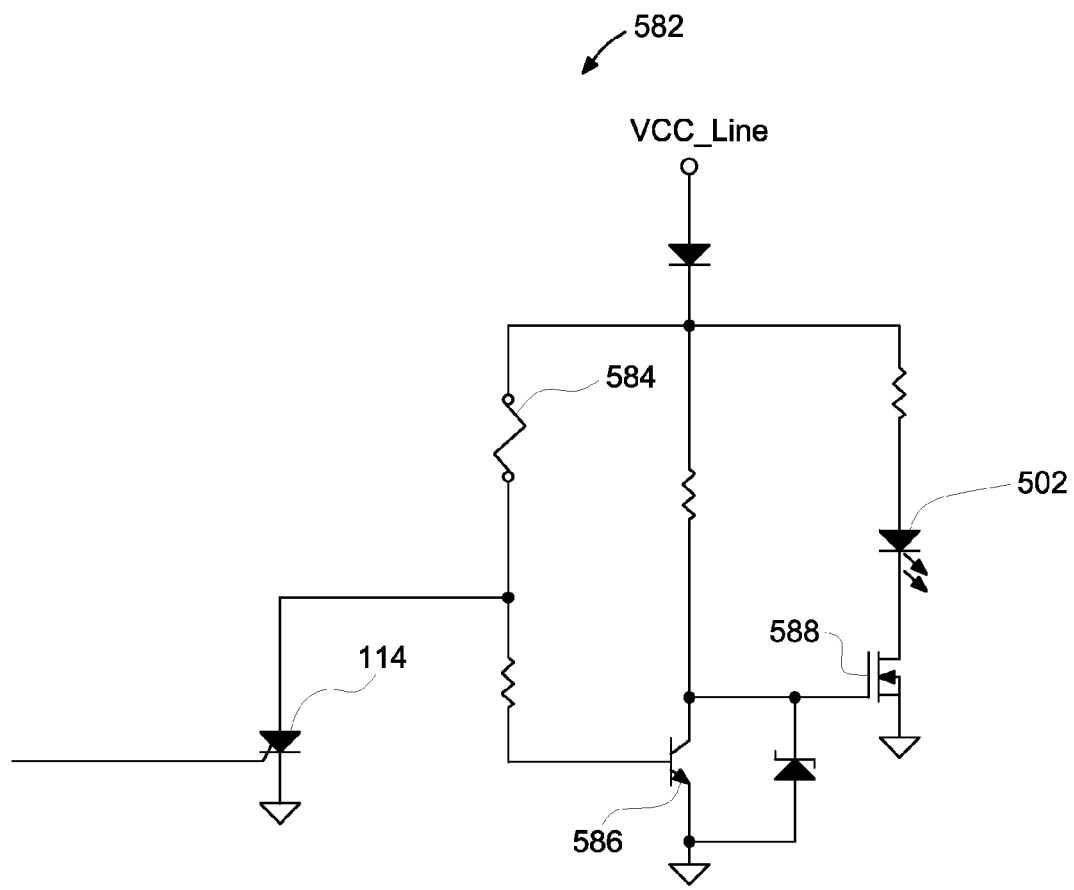
FIG. 11 is a schematic diagram of a first alternative embodiment of the self-test failure indicator circuit shown in FIG. 10

FIG. 11 is a schematic diagram 580 of a first alternative embodiment 582 of self-test failure indicator circuit 26 (shown in FIG. 10). In the first alternative embodiment, self-test failure indicator circuit 582 includes a circuit breaker device 584, for example, a fuse or a latching relay. Circuit breaker device 584 may also include any other circuit protection device that allows self-test failure indicator circuit 582 to function as described herein. Upon a self-test failure, SCR 114 is turned on, which causes device 584 to open. Opening circuit breaker device 584 turns off a fifth transistor 586, and turns on a sixth transistor 588, providing power to self-test indicator 502.

Figure 12:
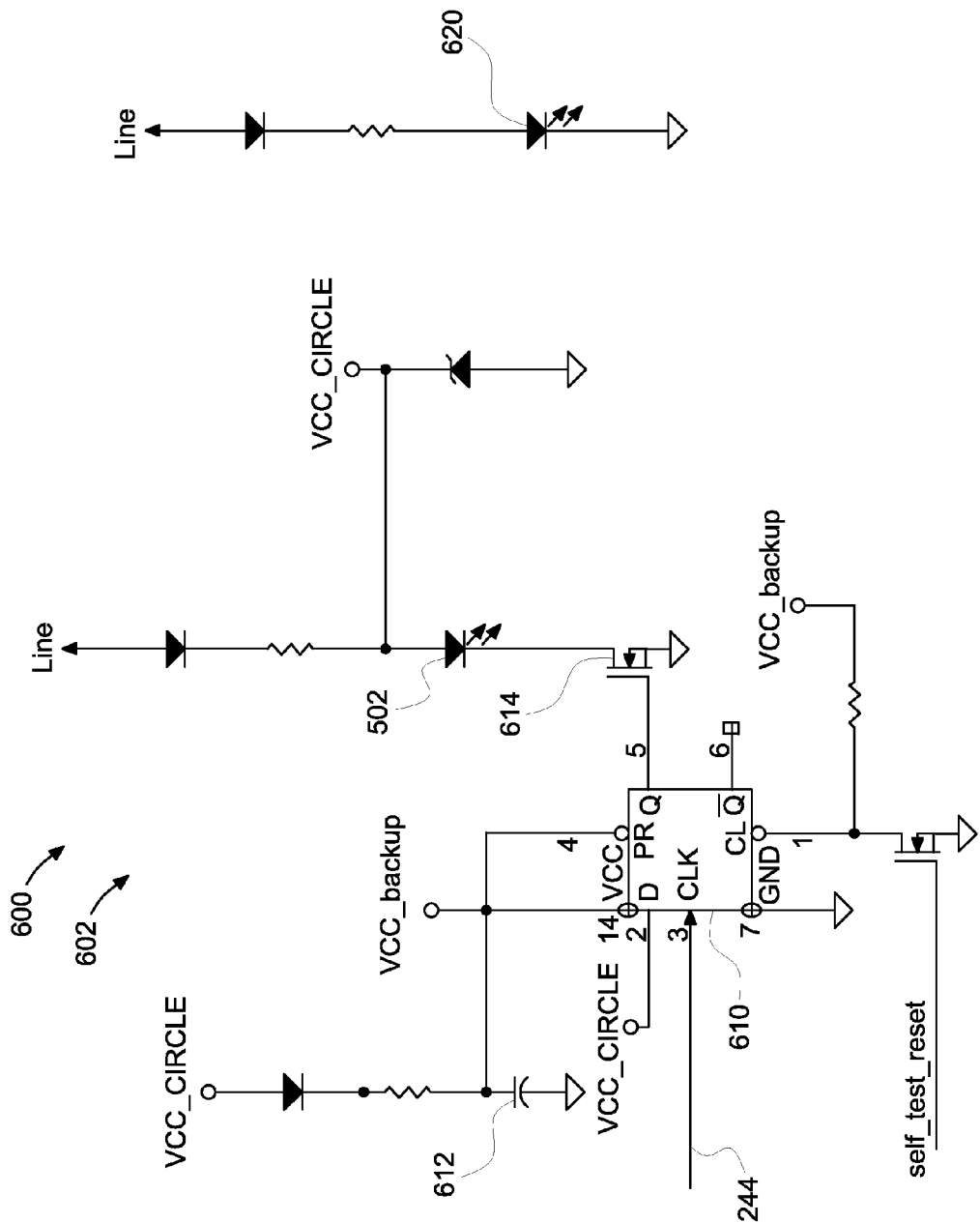
FIG. 12 is a schematic diagram of a second alternative embodiment of the self-test failure indicator circuit shown in FIG. 10

FIG. 12 is a schematic diagram 600 of a second alternative embodiment 602 of self-test failure indicator circuit 26 (shown in FIG. 10). In the second alternative embodiment, self-test failure indicator circuit 602 includes a flip-flop 610, a second capacitor 612, and a seventh transistor 614. Second capacitor 612 is charged while trip circuit 24 is powered (i.e., is closed). Second capacitor 612 provides power to self-test failure indicator 502 for use when trip circuit 24 is tripped. Upon receiving a high signal from output 244, flip-flop 610 is latched to turn on seventh transistor 614, which causes self-test failure indicator 502 to indicate that trip circuit 24 tripped due to a malfunction within electronic trip device 10. In at least some embodiments, circuit 602 also includes a second self-test indicator 620, typically an LED of a different color than self-test failure indicator 502, that provides an indication that power is present, which is a positive indication of proper operation of electronic trip device 10. A loss of ground fault protection is indicated to the user when second self-test indicator 620 is not lit.

Described herein are exemplary methods and apparatus for operating an electronic trip device. More specifically, the methods and apparatus described herein facilitate self-testing a GFCI to ensure the GFCI is operational. To provide the self-test functionality, a leakage current detection circuit is configured to generate an error signal when the test signal is not sensed by the leakage current detection circuit. The error signal may cause a trip circuit to trip or may cause a notification device to provide a user with an indication of a failed self-test. Sensing the test signal may be performed continuously, periodically, or at any other interval of time that allows the electronic trip device to function as described herein.

The methods and apparatus described herein facilitate efficient and economical operation of an electronic trip device. Exemplary embodiments of methods and apparatus are described and/or illustrated herein in detail. The methods and apparatus are not limited to the specific embodiments described herein, but rather, components of each apparatus, as well as steps of each method, may be utilized independently and separately from other components and steps described herein. Each component, and each method step, can also be used in combination with other components and/or method steps.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An electronic trip device comprising:
a test signal generator coupled to at least one of a line conductor and a neutral conductor and configured to create a test signal; and
a leakage current detection circuit configured to compare a current in the line conductor and a current in the neutral conductor, the leakage current detection circuit configured to generate an error signal if the test signal is not detected.

2. An electronic trip device in accordance with claim 1 wherein said test signal generator comprises a leakage current generator configured to create a leakage current having a known current level.

3. An electronic trip device in accordance with claim 2 wherein said leakage current generator comprises at least one of a current source, a resistor, and said leakage current detection circuit.

4. An electronic trip device in accordance with claim 2 wherein said leakage current detection circuit determines the known current level based at least partially on at least one of a resistance value and a power consumption of at least a portion of said electronic trip device.

5. An electronic trip device in accordance with claim 1 wherein said leakage current detection circuit is configured to output the error signal if the test signal is not detected.

6. An electronic trip device in accordance with claim 1 wherein said test signal generator comprises a high-frequency test signal generator configured to generate a high-frequency test signal.

7. An electronic trip device in accordance with claim 6 wherein said leakage current detection circuit is configured to output the error signal if the high-frequency test signal is not detected.

8. An electronic trip device in accordance with claim 1 further comprising a trip circuit coupled to said leakage current detection circuit and configured to receive the error signal and to trip a circuit breaker upon receipt of the error signal.

9. An electronic trip device in accordance with claim 8 wherein a self-test failure indicator circuit is configured to provide a notification that the circuit breaker was tripped because the test signal was not detected.

10. An electronic trip device in accordance with claim 1 further comprising a self-test failure indicator circuit configured to provide a user with a self-test failure notification upon receipt of the error signal.

11. A method for operating an electronic trip device coupled within an electric circuit that includes a line conductor and a neutral conductor, said method comprising:
creating a test signal within at least one of the line conductor and the neutral conductor;
measuring a current flow within the electric circuit; and generating an error signal if the test signal is not detected in the measured current flow.

12. A method in accordance with claim 11 wherein measuring a current flow includes measuring a leakage current by measuring a difference between a current within the line conductor and a current within the neutral conductor.

13. A method in accordance with claim 12 wherein creating a test signal within at least one of the line conductor and the neutral conductor comprises creating a test leakage current within the electric circuit.

14. A method in accordance with claim 13 wherein generating an error signal comprises generating the error signal if the measured leakage current is less than the test leakage current.

15. A method in accordance with claim 13 further comprising storing a predefined value for the test leakage current and comparing the measured leakage current to the stored test leakage current.

16. A method in accordance with claim 15 further comprising determining the test leakage current based at least partially on the stored test leakage current and a measured line voltage.

17. A method in accordance with claim 12 further comprising determining whether the measured leakage current is higher than a predefined threshold associated with a ground fault condition.

18. A method in accordance with claim 17 further comprising adjusting the predefined threshold associated with a ground fault condition to include the stored test leakage current.

19. A method in accordance with claim 11 wherein creating a test signal within at least one of the line conductor and the neutral conductor comprises creating a high frequency test signal within the electric circuit.

20. A method in accordance with claim 19 wherein generating an error signal comprises generating the error signal if the measured leakage current does not include the high frequency test signal.

* * * * *

UNITED STATES PATENT AND TRADEMARK OFFICE
CERTIFICATE OF CORRECTION

PATENT NO. : 8,400,321 B2  
APPLICATION NO. : 12/946419  
DATED : March 19, 2013  
INVENTOR(S) : Williams Page 1 of 1

It is certified that error appears in the above-identified patent and that said Letters Patent is hereby corrected as shown below:

On the Title Page, in Item (74), under "Attorney, Agent, or Firm", in Column 2, Line 1, delete "Operations" and insert -- Operation --, therefor.

In the Specifications:

In Column 2, Line 43, delete "lest" and insert -- test --, therefor.

Signed and Sealed this  
Twenty-first Day of May, 2013

Teresa Stanek Rea  
*Acting Director of the United States Patent and Trademark Office*